US008366826B2

(12) United States Patent  
Veinot et al.

(10) Patent No.: US 8,366,826 B2
(45) Date of Patent: Feb. 5, 2013

(54) METHODS FOR PREPARING SILICON GERMANIUM ALLOY NANOCRYSTALS

(75) Inventors: Jonathan Gordon Conn Veinot, St. Albert (CA); Eric James Henderson, Edmonton (CA)

(73) Assignee: The Governors of the University of Alberta, Edmonton, Alberta (CA)

( * ) Notice: Subject to any disclaimer, the term of this patent is extended or adjusted under 35 U.S.C. 154(b) by 873 days.

(21) Appl. No.: 12/523,210

(22) PCT Filed: Jan. 14, 2008

(86) PCT No.: PCT/CA2008/000101
§ 371 (c)(1),
(2), (4) Date: Jul. 15, 2009

(87) PCT Pub. No.: WO2008/086622
PCT Pub. Date: Jul. 24, 2008

(65) Prior Publication Data
US 2010/0068114 A1     Mar. 18, 2010

Related U.S. Application Data

(60) Provisional application No. 60/885,067, filed on Jan. 16, 2007.

(51) Int. Cl.
*C30B 7/00* (2006.01)
(52) U.S. Cl. .............................. 117/68; 117/11; 423/89
(58) Field of Classification Search .................. None
See application file for complete search history.

(56) References Cited

U.S. PATENT DOCUMENTS

2005/0141809 A1    6/2005   Gardner et al.
2005/0226564 A1    10/2005  Gardner et al.

FOREIGN PATENT DOCUMENTS

JP          63285923 A      11/1988

OTHER PUBLICATIONS

Li, "Epitaxial Growth of Silicon and Germanium (I)", review, Phys. Stat. Sol., 1966, v. 15, No. 3, pp. 3-56.*
R. S. Wagner and W. C. Ellis, "The vapor-Liquid-Solid Mechanism of Crystal Growth and Its Application to Silicon", Transactions of the Metallurgical Society of AIME, Jun. 1965, v. 233, pp. 1053-1064.*
Yang, Y.M., et al., Formation Structure, and Phonon Confinement Effect of Nanocrystalline Si1-Gex In SiO2-Si-Ge Cosputtered Films, Journal of Applied Physics, vol. 96, No. 9, pp. 5239-5242, Nov. 1, 2004.
Weissker, H.-Ch., et al., Excitation Energies and Radiative Lifetimes of Ge1-Six Nanocrystals: Alloying Versus Confinement Effects, Physical Review Letters, vol. 90, No. 8, The American Physical Society, pp. 085501-1-085501-4, Feb. 28, 2003.
Palfinger, G., et al., Absorption Measurement of Strained SiGe Nanostructures Deposited by UHV-CVD, Physica E (Low-dimensional systems and nanostructures), Elsevier Science B.V., pp. 1-8, Mar. 2003.

* cited by examiner

*Primary Examiner* — Yelena G Gakh
(74) *Attorney, Agent, or Firm* — Dinsmore & Shohl LLP (57) ABSTRACT

The present invention relates to a method of preparing silicon germanium alloy nanocrystals by the simultaneous thermal disproportionation of a siliceous material and $GeX_2$ in a conventional tube furnace. Also included is a method of preparing free standing silicon germanium nanocrystals by the acid etching product of the product of the thermal disproportionation of a siliceous material and $GeX_2$.

16 Claims, 4 Drawing Sheets

METHODS FOR PREPARING SILICON GERMANIUM ALLOY NANOCRYSTALS

CROSS-REFERENCE TO RELATED APPLICATIONS

This application is a U.S. national phase entry of International Application No. PCT/CA2008/000101, filed Jan. 14, 2008, which claims the benefit of U.S. Provisional Application Ser. No. 60/885,067.

The present invention relates to methods of preparing silicon germanium alloy nanocrystals, in particular from the simultaneous thermal disproportionation of a siliceous material and a germanium halide. The invention further relates to the preparation of hydride surface terminated nanocrystalline silicon germanium alloys by the acid etching of the reaction product from the thermal disproportionation of the material and germanium halide.

Following the discovery of visible photoluminescence (PL) from porous silicon, (Canham, L. T. *Appl. Phys. Lett.* 1990, 57(10), 1046, which is incorporated herein by reference). Group IV semiconductor nanocrystals have become the focus of intense research due to their unique chemical and optical characteristics. The emergence of size dependent properties in nanoscale silicon and germanium has not only challenged semiconductor band structure models but also expanded the potential applications of these materials. Silicon and germanium nanocrystals (nc-Si, nc-Ge) both display size-dependent PL, (Takeoka, S.; Fujii, M.; Hayashi, S.; Yamamoto, K. *Phys. Rev. B* 1998, 58(12), 7921 and Veinot, J. G. C. *Chem. Comm.* 2006, 40, 4160, which are incorporated herein by reference), resulting from quantum confinement effects and have been investigated for potential integration into a variety of optoelectronic devices. (Pavesi, L.; Dal Negro, L.; Mazzoleni, C.; Franzò, G.; Priolo, F. *Nature* 2000, 408, 440 and Kuo, Y. H.; Lee, Y. K.; Ge, Y.; Ren, S.; Roth, J. E.; Kamins, T. I.; Miller, D. A. B.; Harris, J. S. *Nature* 2005, 437, 1334, which are incorporated herein by reference). It is well established that alloying silicon with germanium affords a convenient method for tailoring the bandgap energy of semiconductor thin films and bulk materials, (Palfinger, G.; Bitnar, B.; Sigg, H.; Müller, E.; Stutz, S.; Grützmacher, D. *Physica E* 2003, 16, 481 which is incorporated herein by reference). Since silicon and germanium form a continuous alloy throughout the entire compositional range, the alloy bandgap energy can be monotonically tuned by increasing the germanium content. In this regard, silicon germanium alloy nanocrystals (nc-$Si_{1-x}Ge_x$), which also exhibit size-dependent PL, (Weissker, H. C.; Furthmüller, J.; Bechstedt, F. *Phys. Rev. Lett.* 2003, 90(8), 085501-1, which is incorporated herein by reference), could offer increased versatility relative to their elemental counterparts because their optical response can be tailored through compositional control, (Takeoka, S.; Toshikiyo, K.; Fujii, M.; Hayashi, S.; Yamamoto, K. *Phys. Rev. B* 2000, 61(23), 15988, which is incorporated herein by reference). These alloy nanocrystals have potential applications in thermophotovoltaics (TPV) and tandem solar cells, as well as in silicon based optoelectronic devices, (Palfinger, G.; Bitnar, B.; Sigg, H.; Müller, E.; Stutz, S.; Grützmacher, D. *Physica E* 2003, 16, 481 and Yang, Y. M.; Wu, X. L.; Siu, G. G.; Huang, G. S.; Shen, J. C.; Hu, D. S. *J. Appl. Phys.* 2004, 96(9), which are incorporated herein by reference). Existing methods for preparing nc-$Si_{1-x}Ge_x$ include: magnetron cosputtering, (Takeoka, S.; Toshikiyo, K.; Fujii, M.; Hayashi, S.; Yamamoto, K. Phys. Rev. B 2000, 61(23), 15988, and Yang, Y. M.; Wu, X. L.; Siu, G. G.; Huang, G. S.; Shen, J. C.; Hu, D. S. *J. Appl. Phys.* 2004, 96(9), 5239, and Yang, Y. M.; Wu, X L.; Yang, L. W.; Kong, F. *J. Crystal Growth* 2006, 291, 358, which are incorporated herein by reference), chemical vapour deposition (CVD), (Palfinger, G.; Bitnar, B.; Sigg, H.; Müller, E.; Stutz, S.; Grützmacher, D. *Physica E* 2003, 16, 481 and Kling, A.; Ortiz, M. I.; Sangrador, J.; Rodríguez, A.; Rodríguez, T.; Ballesteros, C.; Soares, J. C. Nucl. Instr. and Meth. in Phys. Res. B, 2006, 249, 451, which are incorporated herein by reference), thermal evaporation, (Lin, C. W.; Lin, S. Y.; Lee, S. C.; Chia, C. T. *J. Appl. Phys.* 2002, 91(4), 2322), which is incorporated herein by reference), and molecular beam epitaxy (MBE), (Tang, Y. S.; Cai, S.; Jin, G.; Duan, J.; Wang, K. L.; Soyez, H. M.; Dunn, B. S. *Appl. Phys. Lett.,* 1997, 71(17), 2448, which is incorporated herein by reference), all of which require subsequent high-temperature annealing. Furthermore, these infrastructure intensive fabrication methods only afford small quantities of oxide embedded or substrate supported nanocrystals. Current methods for preparing freestanding nc-$Si_{1-x}Ge_x$ also require elaborate equipment and experimental design while affording particles of ill-defined size and shape. (Lin, C. W.; Lin, S. Y.; Lee, S. C.; Chia, C. T. *J. Appl. Phys.* 2002, 91(4), 2322 and Liao, Y. C.; Lin, S. Y.; Lee, S. C.; Chia, C. T. *App. Phys. Let.* 2000, 77(26), 4328, which are incorporated herein by reference).

There remains a need for methods of preparing semiconductor nanocrystals with photoluminescence properties.

Herein is reported a straightforward method for synthesizing oxide encapsulated, as well as freestanding hydride surface terminated, nanocrystalline silicon germanium (nc-$Si_{1-x}Ge_x$) from the simultaneous thermally induced disproportionation of a siliceous material, such as hydrogen silsesquioxane (HSQ), and a germanium halide in a conventional tube furnace.

Accordingly, the present invention relates to a method of preparing silicon-germanium alloy nanocrystals comprising contacting a siliceous material and a compound of the formula $GeX_2$, wherein X is Br or I, under conditions to induce the thermal disproportionation of the material and $GeX_2$ to produce silicon-germanium alloy nanocrystals.

The invention also includes a method for preparing free standing silicon germanium alloy nanoparticles comprising acid etching the nanocrystalline silicon germanium alloys prepared using the method described above under conditions to liberate the silicon germanium alloy nanoparticles from an oxide matrix formed during their preparation.

The invention also includes silicon germanium alloy nanoparticles prepared using the methods of the present invention as well as the use of such nanoparticles in, for example, thermophotovoltaics (TPV), tandem solar cells, and silicon based microelectronic and optoelectronic devices.

Unlike other nc-$Si_{1-x}Ge_x$ preparative methods that employ reagents such as silane and germane that require specialized handling procedures, (Palfinger, G.; Bitnar, B.; Sigg, H.; Müller, E.; Stutz, S.; Grützmacher, D. *Physica E* 2003, 16, 481 and Kling, A.; Ortiz, M. I.; Sangrador, J.; Rodríguez, A.; Rodríguez, T.; Ballesteros, C.; Soares, J. C. *Nucl. Instr. and Meth. in Phys. Res. B,* 2006, 249, 451, which are incorporated herein by reference), the stating materials utilized in the present invention are easily manipulated using standard laboratory techniques, rendering the methods of the present invention advantageous over other known methods. Furthermore, the dependence of the band gap on the germanium content allows for the production of tunable band gap semiconductor materials.

Other features and advantages of the present invention will become apparent from the following detailed description. It should be understood, however, that the detailed description and the specific examples while indicating preferred embodiments of the invention are given by way of illustration only, since various changes and modifications within the spirit and scope of the invention will become apparent to those skilled in the art from this detailed description.

The invention will now be described in relation to the drawings in which.

The preparation of polyhedral Si$_{1-x}$Ge$_x$ alloy nanocrystals via the simultaneous thermally induced disproportionation of molecular precursors, hydrogen silsesquioxane and germanium diiodide, has been performed in a conventional tube furnace. X-ray diffraction analysis suggested a composition consistent with Si$_{0.45}$Ge$_{0.55}$ that remained constant regardless of annealing time and HF etching. X-ray diffraction, Raman spectroscopy, transmission electron microscopy, and energy dispersive electron diffraction all confirmed the presence of nc-Si$_{0.45}$Ge$_{0.55}$. Fourier transform infrared spectroscopy confirmed nanoparticle hydride surface termination upon HF etching.

Accordingly, the present invention relates to a method of preparing silicon-germanium alloy nanocrystals comprising contacting a siliceous material and a compound of the formula GeX$_2$, wherein X is Br or I, under conditions to induce the thermal disproportionation of the material and GeX$_2$ to produce silicon-germanium alloy nanocrystals.

By "silicon germanium alloy nanocrystals", it is meant nanoparticles comprising silicon and germanium that are substantially crystalline. The size of the particles may be in the range of 8-17 nm. In an embodiment of the invention the silicon germanium alloy nanocrystals are polyhedral nanocrystals of the formula Si$_{1-x}$Ge$_x$, in particular Si$_{0.45}$Ge$_{0.55}$.

In an embodiment of the invention, X is I.

In another embodiment of the invention the siliceous material is silica or a silsesquioxane of the formula (RSiO$_{1.5}$)$_n$, wherein R is H or any organic group that is not removed from the silicon atom under silica forming reaction conditions and n is an integer in the range of 4-50, suitably 4-30, more suitably 6-12. Examples of organic groups that are not removed from the silicon atom under silica forming reaction conditions would be known to those skilled in the art and include alkyl groups, such as linear and branched chain C$_{1-20}$alkyl, C$_{2-20}$alkenyl or C$_{2-20}$alkynyl, cyclo-C$_{3-20}$alkyl or aryl. All of these groups may be optionally substituted, with for example, one or more halo, such as fluoro or C$_{1-6}$alkyl, and/or these groups may have one to five, suitably one to three, carbon atoms replaced with a heteroatom selected from O, S and N. Silsesquioxanes are usually formed by hydrolytic multiple condensation of RSiY$_3$ (where Y is a highly reactive substituent such as Cl or an alkoxide) in an acetone/water mixture to form dimers, quadrimers, etc. (see J. F. Brown and L. H. Vogt, *J. Am. Chem. Soc.,* 1965, 87, 4313). In another embodiment of the invention R is H and, according the siliceous material is hydrogen silsesquioxane (HSQ). The HSQ may suitably be in the form of a solid. Solid HSQ may be obtained, for example, by removing the solvent from a stock solution comprising HSQ. HSQ solutions may be any suitable solution comprising HSQ and a carrier solvent. Such solutions are available, for example, from Dow Corning.

In an another embodiment of the invention the siliceous material is silica (SiO$_2$) prepared using sol gel processes.

The conditions to induce the thermal disproportionation of the siliceous material and GeX$_2$ to produce silicon-germanium alloy nanocrystals may be determined by a person skilled in the art by varying the temperature and time of the thermal treatment until optimal production of silicon-germanium alloy nanocrystals is observed. The observation of silicon-germanium alloy nanocrystals may be made using techniques known in the art, such as, for example, X-ray powder diffraction (XRD), Raman spectroscopy, transmission electron microscopy (TEM) and energy dispersive electron diffraction. In the XRD patterns, the characteristic peaks appear at about 2θ=28°, 47° and 55° for the (111), (220) and (311) reflections, respectively of diamond lattice nanocrystalline-Si$_{1-x}$Ge$_x$ (nc-Si$_{1-x}$Ge$_x$). In the Raman spectra, peaks at about 292, 395 and 507 cm$^{-1}$ are characteristic of (nc-Si$_{1-x}$Ge$_x$).

In an embodiment of the invention, the conditions to induce the thermal disproportionation of the siliceous materials and GeX$_2$ to produce silicon-germanium alloy nanocrystals comprises heating intimately mixed siliceous material and GeX$_2$ to a temperature in the range of 900° C.-1600° C., suitably to about 1100° C., for about 1 to about 24 hours, suitably about 5 to about 20 hours. In a further embodiment of the invention, the thermal disproportionation is carried out in a slightly reducing atmosphere, for example in an atmosphere comprising an inert gas, such as argon, and about 1% to about 10%, suitably about 5% by volume of hydrogen gas. In a further embodiment of the invention, the heating is performed in a conventional tube furnace.

By "intimately mixed" it is meant that the siliceous material and GeX$_2$ are combined in such a way so as to provide a substantially uniform mixture of these two substances. This may be done, for example, by mechanical grinding with a mortar and pestal.

The silicon-germanium alloy nanocrystals produced using the method described above are encapsulated in an SiO$_2$-like matrix, i.e. are "oxide encapsulated". The method of the present invention further comprises treating the oxide encapsulated silicon-germanium alloy nanocrystals with an acid, for example a hydrofluoric acid (HF) solution to produce freestanding silicon-germanium alloy nanocrystals. This acid treatment may be done, for example, in aqueous alcoholic solutions for about 0.5-2 hours, suitably about 1 hour, followed by washing with water, suitably distilled water. Prior to acid treatment the oxide encapsulated silicon-germanium alloy nanocrystals may also be washed to remove impurities, for example bulk germanium or GeX$_4$, where X is halo, such as iodo.

Functionalization of freestanding hydride surface terminated silicon-germanium alloy nanocrystals (prepared from the thermal disproportionation of HSQ and GeX$_2$) is a further aspect of the present invention.

The invention also includes silicon-germanium alloy nanocrystals prepared using the methods of the present invention as well as the use of such nanocrystals in, for example, thermophotovoltaics (TPV), tandem solar cells or silicon based microelectronic and optoelectronic devices.

The following non-limiting examples are illustrative of the present invention:

EXAMPLES

Reagents and materials. Hydrogen silsesquioxane (HSQ) was purchased from Dow Corning as a 17% w/w solution in methylisobutyl ketone (tradename FOx-17®). Germanium diiodide ($GeI_2$, 99.99+%) was purchased from Sigma-Aldrich and used as received. HSQ and $GeI_2$ were stored in subdued light in an argon filled glovebox (<0.1 ppm $H_2O$, 0.6 ppm $O_2$). Hydrogen peroxide (30% aqueous solution, EMD), methanol (>99.8%, Fisher Scientific), electronic grade hydrofluoric acid (HF, 49% aqueous solution, J. T. Baker), and reagent grade ethanol (95%, Sigma-Aldrich) were used as received. High purity water (18.2 M/cm) was obtained from a Barnstead Nanopure Diamond purification system.

Example 1

Synthesis of oxide encapsulated nc-$Si_{0.45}Ge_{0.55}$. Removal of the solvent from the HSQ stock solution in vacuo yields a white solid that was used without further purification. In a typical preparation, HSQ (0.20 g, 0.47 mmol) and $GeI_2$ (1.60 g, 4.90 mmol) were intimately mixed by mechanical grinding with an agate mortar and pestle in the glovebox atmosphere to yield a uniform light yellow powder. The free flowing powder was transferred to a quartz reaction boat in a Linberg Blue UP150 high temperature tube furnace and heated to a maximum processing temperature of 1100° C. at ca. 60° C./min in a slightly reducing atmosphere (5% $H_2$, 95% Ar). Reaction mixtures were heated for 1, 5, 10, and 20 hours to yield $GeI_4$ and 1, 2, 3, and 4, respectively, as glassy brown solids (12% yield).

Example 2

Liberation of hydride surface terminated nc-$Si_{0.45}Ge_{0.55}$. Sample 2 was ground into a fine powder and sonicated in a 5:1 mixture of $H_2O_2$:MeOH at 40° C. for 60 minutes to remove any bulk Ge and $GeI_4$ impurities. After drying the powder in an argon stream, hydride surface terminated nc-$Si_{0.45}Ge_{0.55}$ were liberated from the oxide matrix upon etching 2 with hydrofluoric acid (HF) ethanol-water solutions for 60 minutes and isolated as an ultrafine black powder, 5, using repeated centrifugation/sonication cycles in DI water (10% yield).

Example 3

Material characterization. Bulk crystallinity of oxide encapsulated and freestanding nc-$Si_{0.45}Ge_{0.55}$ was evaluated by X-ray diffraction (XRD) using an INEL XRG 3000 X-ray diffractometer equipped with a Cu $K_\alpha$ radiation source ($\lambda$=1.5406 Å). The bonding structure of the nc-$Si_{0.45}Ge_{0.55}$ core was investigated by Raman spectroscopy using a Renishaw inVia Raman microscope equipped with a 785 nm diode laser and a power of 7.94 mW on the sample. Bonding was also investigated by Fourier transform infrared spectroscopy using a Nicolet Magna 750 IR spectrophotometer. Crystal morphology, size distribution, and chemical composition were evaluated by transmission electron microscopy (TEM) and energy dispersive X-ray spectroscopy (EDX) using a JEOL-2010 (LaB6 thermionic emission source) electron microscope with an accelerating voltage of 200 keV. TEM samples of freestanding nc-$Si_{0.45}Ge_{0.55}$ were dropcoated from a clear, brown methanol suspension onto a carbon coated copper grid.

The preparation of nc-Si from the thermally induced disproportionation of HSQ in a reducing atmosphere was recently reported. (Hessel, C. M.; Henderson, E. J.; Veinot, J. G. C. *Chem. Mat.* 2006, in press, which is incorporated herein by reference). In this earlier contribution, it was proposed that noncrystalline silicon nanodomains formed from the rapid thermal decomposition of silane originating from the collapse of the HSQ cage structure at approximately 350-500° C. These domains subsequently crystallized with heating above 900° C. Germanium diiodide ($GeI_2$) is known to disproportionate at 350° C. to yield elemental Ge and $GeI_4$, (Cronemeyer, D. C. *J. Appl. Phys.* 1958, 29(12), 1730, which is incorporated herein by reference). The present invention provides a thermolytic method for synthesizing Group IV semiconductor nanomaterials by preparing silicon-germanium alloy nanocrystals (nc-$Si_{0.45}Ge_{0.55}$) from the simultaneous thermal decomposition of HSQ and $GeI_2$. Unlike other nc-$Si_{1-x}Ge_x$ preparative methods that employ reagents such as silane and germane that require specialized handling procedures, (Palfinger, G.; Bitnar, B.; Sigg, H.; Müller, E.; Stutz, S.; Grützmacher, D. *Physica E* 2003, 16, 481 and Kling, A.; Ortiz, M. I.; Sangrador, J.; Rodríguez, A.; Rodríguez, T.; Ballesteros, C.; Soares, J. C. *Nucl. Instr. and Meth. in Phys. Res. B*, 2006, 249, 451, which are incorporated herein by reference). HSQ and $GeI_2$ are easily manipulated using standard laboratory techniques. A summary of the decomposition reactions are provided in Scheme 1 which shows the thermally induced reactions providing nc-$Si_{0.45}Ge_{0.55}$ from the simultaneous thermal disproportionation of HSQ and $GeI_2$.

Scheme 1

Figure 1:
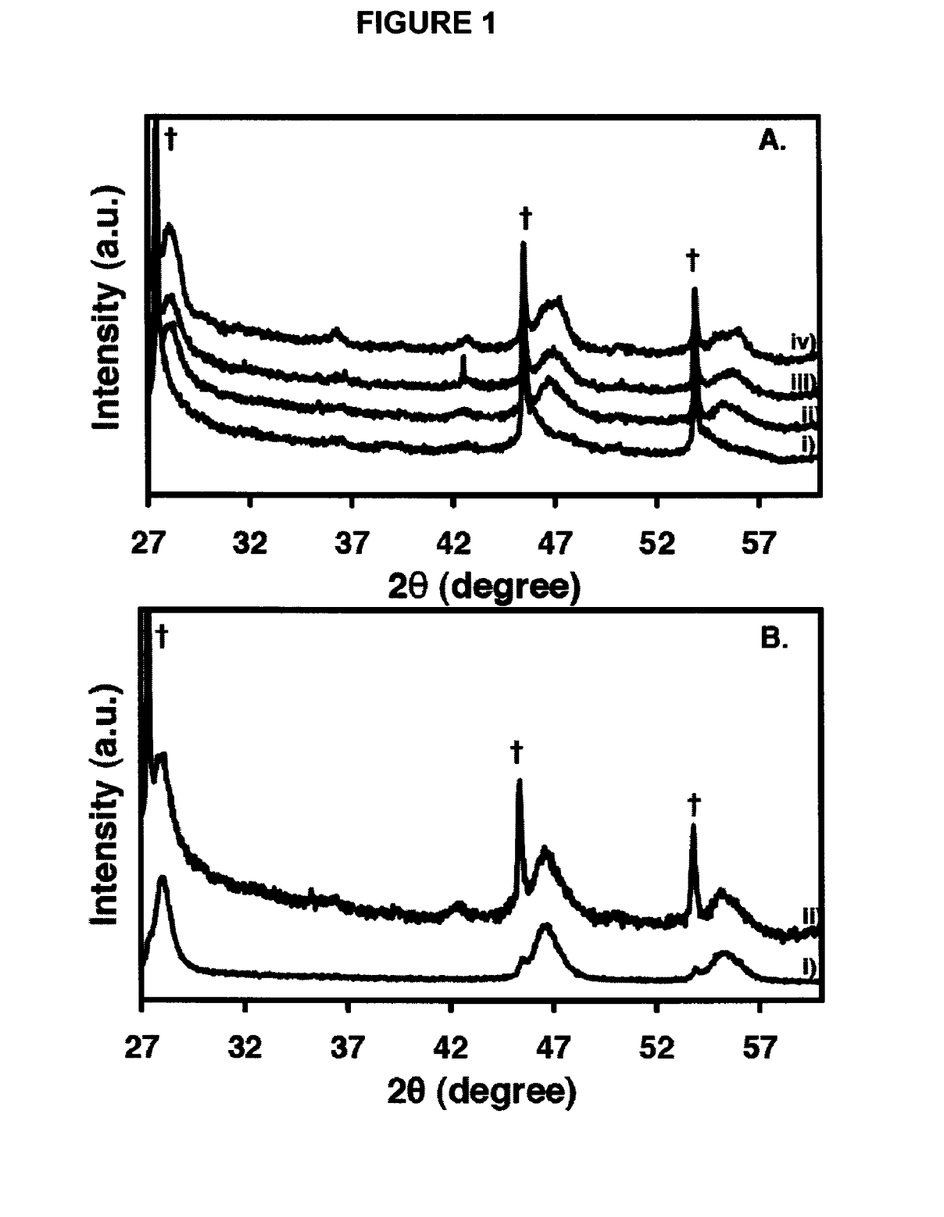
FIG. 1 shows A) XRD patterns obtained for: i) 1, ii) 2, iii) 3, and iv) 4, showing the characteristic (111), (220), and (311) reflections of nc-Si$_{0.45}$Ge$_{0.55}$. B) XRD patterns obtained for: i) 5 and ii) 2. († denote reflections arising from bulk Ge impurities.)

HSQ and $GeI_2$ were intimately combined and annealed at 1100° C. in a standard tube furnace for set reaction times. Influence of reaction time was monitored using X-ray powder diffraction (FIG. 1A). After annealing for one hour, 1, only sharp diffraction peaks corresponding to bulk diamond lattice Ge can be definitively assigned. These bulk Ge impurities result from Ge crystallization outside of the $SiO_2$-like matrix that forms with HSQ decomposition. Weak, broad reflections appearing as shoulders on the bulk Ge reflections are also observed for 1, however it is impossible to definitively assign them to nc-$Si_{0.45}Ge_{0.55}$. Prolonged heating of the reaction mixture yielded samples 2-4. XRD patterns of these samples (FIG. 1A) clearly show broad diffraction peaks appearing at ca. 2θ=28°, 47°, and 55° which are readily indexed to the characteristic (111), (220), and (311) reflections of diamond lattice $Si_{1-x}Ge_x$. FIG. 1A shows that the diffraction peaks do not shift in 2, 3, and 4, highlighting that the elemental composition of the alloy remains constant regardless of thermal processing time. The experimentally determined alloy lattice constant was used to estimate the alloy composition as $Si_{0.45}Ge_{0.55}$ using equation (4), where a is the lattice constant and x is the Ge mole fraction, (Yang, Y. M.; Wu, X. L.; Huang, G. S.; Hu, D. S.; Siu, G. G. *Phys. Lett. A,* 2005, 338, 379, which is incorporated herein by reference).

$$a(x)=0.002733x^2+0.01992x+0.5431 \text{ nm} \quad (4)$$

It is also noted that nc-$Si_{0.45}Ge_{0.55}$ reflection intensities in the XRD patterns of 2-4 increase with extended heating. Similar time dependent intensity relationships observed for $Si_{1-x}Ge_x$ have been attributed to increased particle crystallinity, (Hwang, C. W.; Ryu, M. K.; Kim, K. B.; Lee, S. C.; Kim, C. S. *J. Appl. Phys.* 1995, 77(7), 3042, which is incorporated herein by reference). The XRD patterns of 2-4 exhibit peak broadening independent of annealing time, suggesting a constant nanoparticle size. The Debye-Scherrer relationship affords an estimated nanocrystal diameter of 6.8 nm for 2-4. FIG. 1B shows XRD patterns for 2 and 5, nc-$Si_{0.45}Ge_{0.55}$ liberated from the oxide matrix through HF etching of 2. It is clear that the (111), (220), and (311) reflections for 5 are consistent with the patterns obtained for 2. FIG. 1B also shows a dramatic decrease in the intensity of bulk Ge reflections after the liberation process. Residual bulk Ge is likely the result of incomplete etching. It is clear that the liberated nc-$Si_{0.45}Ge_{0.55}$ maintain crystallinity and a constant composition throughout the etching process.

Figure 2:
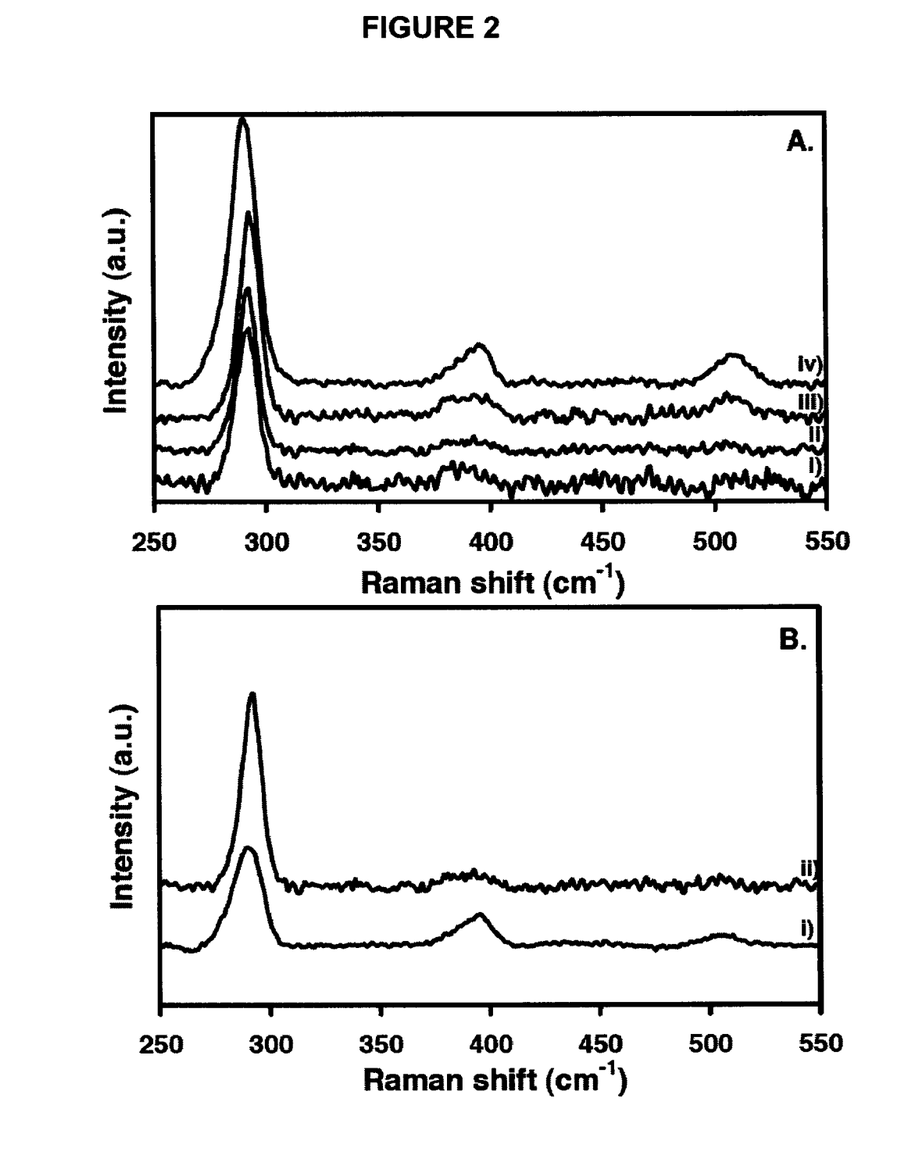
FIG. 2 shows A) Raman spectra obtained for: i) 1, ii) 2, iii) 3, and iv) 4, showing the Ge—Ge, Si—Ge, and Si—Si optical phonon vibrations characteristic of nc-Si$_{0.45}$Ge$_{0.55}$ B) Raman spectra obtained for: i) 5 and ii) 2.

FIG. 2A shows baseline corrected Raman spectra for 1-4. Each spectrum shows asymmetric peaks at ca. 292, 395, and 507 $cm^{-1}$, corresponding to vibrations of the Ge—Ge, Si—Ge, and Si—Si optical phonons (OP), respectively. As expected, the Ge—Ge OP vibration is the most intense because of the bulk Ge impurities identified in the XRD patterns. It is clear that prolonged annealing increases the intensities of the OP vibrations characteristic of nc-$Si_{0.45}Ge_{0.55}$. This can be related to an increase in the number of Ge—Ge, Si—Ge and Si—Si bonds, consistent with the XRD data that suggests increased particle crystallinity upon extended annealing. FIG. 2B shows baseline corrected Raman spectra for 2 and 5. The Raman spectrum of 5 shows a decrease in the Ge—Ge OP vibration intensity and an increase in the intensity for Si—Ge and Si—Si vibrations, consistent with the removal of the bulk Ge impurities during the liberation procedure. Shifts in the Raman frequencies of nc-$Si_{1-x}Ge_x$ with respect to bulk Si and bulk Ge can be related to elemental composition, phonon confinement effects and particle size, and stress relaxation of matrix embedded particles, (Yang, Y. M.; Wu, X. L.; Siu, G. G.; Huang, G. S.; Shen, J. C.; Hu, D. S. *J. Appl. Phys.* 2004, 96(9), which is incorporated herein by reference). However, particle size and composition are not readily obtained through the Raman data because it is non-trivial to distinguish between these three factors and their relative contributions to the overall shift.

Figure 3:
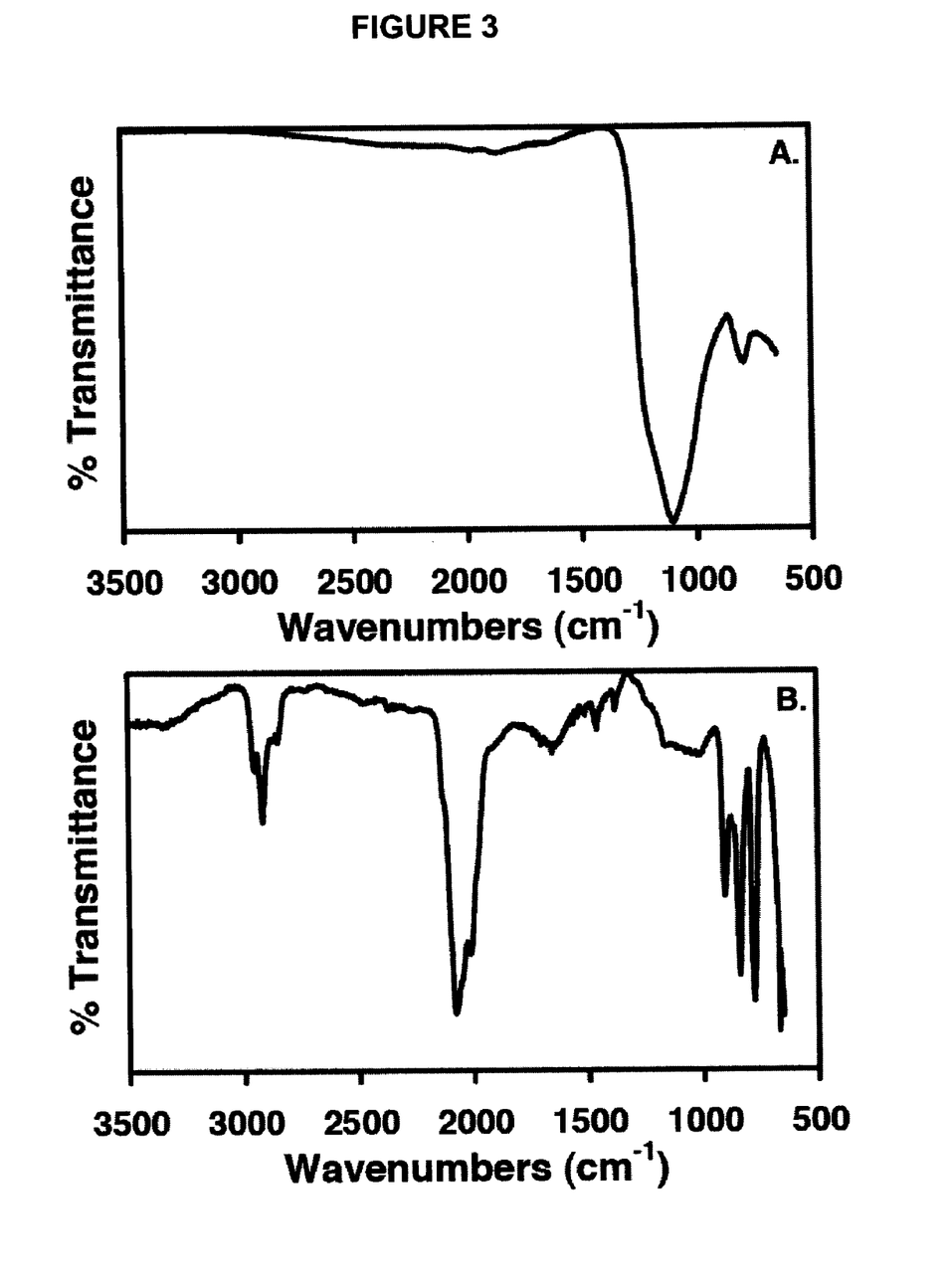
FIG. 3 shows A) FTIR spectrum obtained for 2, showing a broad band associated with Si—O—Si bending (ca. 1100 cm$^{-1}$) of the SiO$_2$-like matrix. B) FTIR spectrum obtained for 5, showing Si—H$_x$ and Ge—H$_x$ stretches (ca. 2100 cm$^{-1}$) and scissoring (1000 cm$^{-1}$) consistent with hydride terminated nc-Si$_{0.45}$Ge$_{0.55}$.

FIG. 3 shows the FTIR spectra of 2 and 5. The FTIR spectrum of 2 (FIG. 3A) is dominated by a broad band associated with Si—O—Si bending (ca. 1100 $cm^{-1}$) of the $SiO_2$-like matrix. Upon etching with HF acid, 5 (FIG. 3B), the oxide is removed and the nanocrystal surface is dominated by Si—H and Ge—H functionalities, as evidenced by the vibrations at ca. 2100 $cm^{-1}$ (Si–Hx and Ge—Hx stretches). Bending frequencies of Si—O—Si bonding at 1400 $cm^{-1}$ remain, suggesting the presence of a small amount of surface oxide arising from incomplete etching of the oxide matrix and post-etching oxidation of the nanocrystal surface. Further evidence for hydride surface termination are the peaks at 1000 $cm^{-1}$ which can be assigned to $S_1$—$H_x$ and Ge—$H_x$ scissoring. Peaks appearing at ca. 2900 $cm^{-1}$ are from residual ethanol used in the etching process. Hydride terminated nanocrystal surfaces have been shown to act as reaction platforms for the formation of Si—C and Ge—C bonds via hydrosilylation and hydrogermylation reactions, respectively, (Veinot, J. G. C. *Chem. Comm.* 2006, 40, 4160 and Fok, E.; Shih, M.; Meldrum, A.; Veinot, J. G. C. *Chem. Comm.* 2004, 10, 386, which are incorporated herein by reference). The present invention therefore also includes surface functionalization of nc-$Si_{0.45}Ge_{0.55}$.

Figure 4:
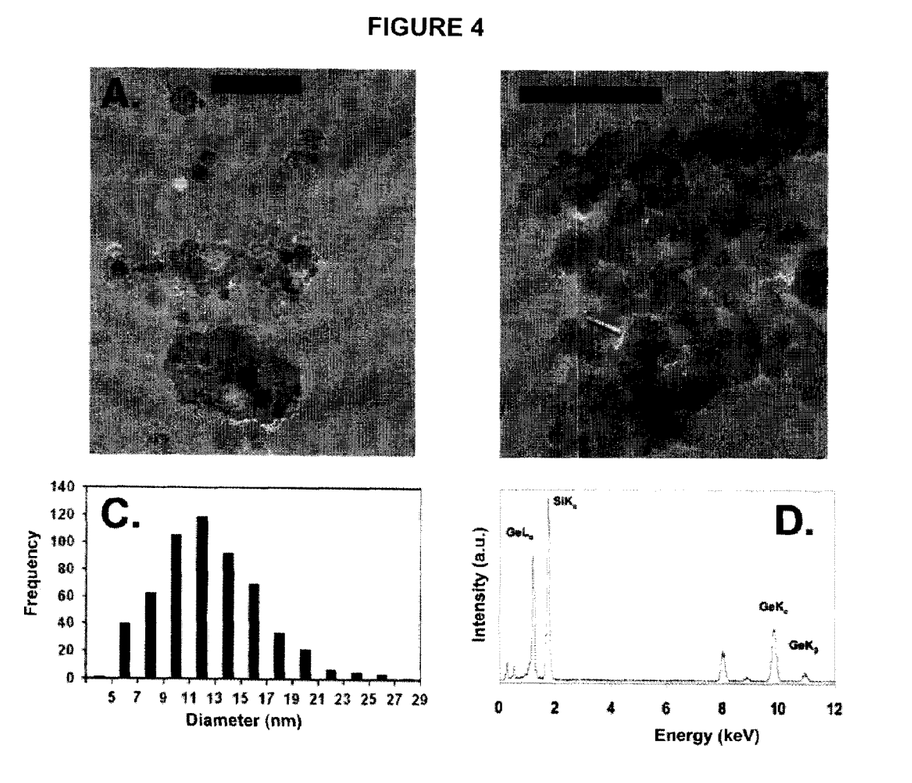
FIGS. 4 A) and B) show representative bright field transmission electron micrographs of 5 at different magnifications (bar=100 nm). C) Size distribution of 5 showing a mean particle diameter of 12.68 nm (2=4.09 nm; n=565). D) Energy dispersive X-ray spectrum of 5 illustrating a nanoparticle composition only of Si and Ge.

FIGS. 4A and 4B show representative bright-field TEM images at different magnifications of freestanding nc-$Si_{0.45}Ge_{0.55}$, 5. It is clear that many of the nanocrystals have aggregated, most likely resulting from hydrophobic interactions between the hydride surface terminated nanocrystals and water impurities in the methanol suspension. From these images, it can be seen that the nanocrystals adopt polyhedral morphologies. FIG. 4C shows the measured size distribution with a mean diameter of 12.68 nm ($2\sigma$=4.09 nm; n=565). This value differs significantly from the calculated value determined using Scherrer analysis of XRD signal broadening. Inhomogeneous strain within the nanocrystals resulting from alloying defects and crystal lattice mismatches could cause an increase in XRD signal broadening and account for the small crystal size calculated from the Scherrer analysis. (Tian, H. H.; Atzmon, M. *Phil. Mag. A* 1999, 79(8), 1769, which is incorporated herein by reference). FIG. 4D shows the EDX spectrum of liberated nc-$Si_{0.45}Ge_{0.55}$, illustrating that the nanocrystals are composed only of Si and Ge. The other peaks are due to minor surface oxidation (O, 0.53 keV) and the TEM sample grid (C, 0.28 keV; Cu, 8.03 keV and 8.91 keV).

Where a term in the present application is found to be defined differently in a document incorporated herein by reference, the definition provided herein is to serve as the definition for the term.

While the present invention has been described with reference to what are presently considered to be the preferred examples, it is to be understood that the invention is not limited to the disclosed examples. To the contrary, the invention is intended to cover various modifications and equivalent arrangements included within the spirit and scope of the appended claims.

The invention claimed is:

1. A method of preparing silicon-germanium alloy nanocrystals comprising contacting a siliceous material and a compound of the formula $GeX_2$, wherein X is Br or I, under conditions to induce the thermal disproportionation of the material and $GeX_2$ to produce silicon-germanium alloy nanocrystals.

2. The method according to claim 1, wherein the silicon germanium alloy nanocrystals are polyhedral nanocrystals of the formula $Si_{1-x}Ge_x$.

3. The method according to claim 1, wherein the silicon germanium alloy nanocrystals are polyhedral nanocrystals of the formula $Si_{0.45}Ge_{0.55}$.

4. The method according to claim 1 wherein X is I.

5. The method according to claim 1, wherein the siliceous material is silica or a silsesquioxane of the formula $(RSiO_{1.5})_n$, wherein R is H or any organic group that is not removed from the silicon atom under silica forming reaction conditions and n is an integer in the range of 4-50.

6. The method according to claim 5, wherein R is selected from linear and branched chain $C_{1-20}$alkyl, $C_{2-20}$alkenyl and $C_{2-20}$alkynyl, cyclo-$C_{3-20}$alkyl and aryl, unsubstituted, or substituted with one or more of halo or $C_{1-6}$alkyl, or have one to five carbon atoms replaced with a heteroatom selected from O, S and N, or both.

7. The method according to claim 5, wherein the siliceous material is silica prepared using sol gel processes.

8. The method according to claim 1 wherein the siliceous material is hydrogen silsesquioxane (HSQ).

9. The method according to claim 8, wherein the conditions to induce the thermal disproportionation of the HSQ and the compound of the formula $GeX_2$ to produce silicon-germanium alloy nanocrystals comprise heating intimately mixed HSQ and the compound of the formula $GeX_2$ to a temperature in the range of 900-1600° C. for about 1 to about 24 hours, in a slightly reducing atmosphere.

10. The method according claim 9, wherein the conditions to induce the thermal disproportionation of the HSQ and the compound of the formula $GeX_2$ to produce silicon-germanium alloy nanocrystals comprise heating intimately mixed HSQ and the compound of the formula $GeX_2$ to a temperature of about 1100° C. for about 5 to about 20 hours, in a slightly reducing atmosphere.

11. The method according to claim 10, wherein the slightly reducing atmosphere is an atmosphere comprising an inert gas and about 1% to about 10% of hydrogen.

12. The method according to claim 9, wherein the heating is performed in a conventional tube furnace.

13. The method according to claim 1 further comprising treating the silicon-germanium alloy nanocrystals with an acid, to produce freestanding silicon-germanium alloy nanocrystals.

14. The method according to claim 13, wherein the acid is a hydrofluoric acid (HF) solution.

15. The method according to claim 13, wherein the acid treatment is done in a aqueous alcoholic solutions for about 0.5-2 hours, followed by washing with water.

16. The method according to claim 13, wherein, prior to acid treatment, the silicon-germanium alloy nanocrystals are washed to remove impurities.

* * * * *

UNITED STATES PATENT AND TRADEMARK OFFICE
CERTIFICATE OF CORRECTION

PATENT NO.        : 8,366,826 B2
APPLICATION NO.   : 12/523210
DATED             : February 5, 2013
INVENTOR(S)       : Jonathan Gordon Conn Veinot et al.

It is certified that error appears in the above-identified patent and that said Letters Patent is hereby corrected as shown below:

In the Claims:

Col. 10, Line 10, Claim 15, "in a aqueous alcoholic solutions" should read --in an aqueous alcoholic solution--.

Signed and Sealed this
Twenty-third Day of July, 2013

Teresa Stanek Rea
*Acting Director of the United States Patent and Trademark Office*